United States Patent [19]

Higuchi

[11] Patent Number: 5,093,710
[45] Date of Patent: Mar. 3, 1992

[54] SEMICONDUCTOR DEVICE HAVING A LAYER OF TITANIUM NITRIDE ON THE SIDE WALLS OF CONTACT HOLES AND METHOD OF FABRICATING SAME

[75] Inventor: Toshihiko Higuchi, Nagano, Japan

[73] Assignee: Seiko Epson Corporation, Tokyo, Japan

[21] Appl. No.: 548,080

[22] Filed: Jul. 5, 1990

[30] Foreign Application Priority Data

Jul. 7, 1989 [JP] Japan ................................. 1-176261
Jul. 11, 1989 [JP] Japan ................................. 1-178517

[51] Int. Cl.⁵ ...................... H01L 23/48; H01L 29/44; H01L 29/52; H01L 29/60
[52] U.S. Cl. .......................................... 357/71; 357/65; 357/67; 437/192; 437/194; 437/195; 437/197
[58] Field of Search ............................. 357/65, 67, 71; 437/180, 189, 192, 194, 195, 197

[56] References Cited

U.S. PATENT DOCUMENTS

| | | | |
|---|---|---|---|
| 4,840,302 | 6/1989 | Gardner et al. | 228/123 |
| 4,922,321 | 5/1990 | Arai et al. | 357/68 |
| 4,961,822 | 10/1990 | Liao et al. | 156/656 |
| 4,965,656 | 10/1990 | Koubuchi et al. | 357/71 |
| 4,974,056 | 11/1990 | Brodsky et al. | 357/71 |

OTHER PUBLICATIONS

T. Hariu et al., The Properties of Al-Cu/Ti Films Sputter Deposited at Elevated Temperatures and High DC Bias, pp. 210-214, IEEE/IRPS 1989.

*Primary Examiner*—Rolf Hille
*Assistant Examiner*—David Ostrowski
*Attorney, Agent, or Firm*—Spensley Horn Jubas & Lubitz

[57] ABSTRACT

Method of fabricating a semiconductor device having minute contact holes formed in an insulating film that is formed on a first metal layer. A layer of titanium nitride is formed on the side walls in the holes and on the insulating layer. A second metal layer is formed on the layer of titanium nitride. The second metal layer consists mainly of aluminum and is not thinned in the holes. The second metal layer and the underlying titanium nitride layer are photolithographically patterned.

16 Claims, 2 Drawing Sheets

SEMICONDUCTOR DEVICE HAVING A LAYER OF TITANIUM NITRIDE ON THE SIDE WALLS OF CONTACT HOLES AND METHOD OF FABRICATING SAME

BACKGROUND OF THE INVENTION

1. Field of the Invention

The present invention relates to a method of forming electrical leads on a semiconductor device and to the structure of the leads and, more particularly, to a method of forming joints between first and second leads as well as to the structure of the joints between the leads.

2. Description of the Prior Art

In the past, first and second leads have been connected together on a semiconductor device in the manner to be described below. After forming a first metal layer for creating first leads, an insulating film is formed on the metal layer. Then, holes (hereinafter referred to as the contact holes) are formed in the insulating film. Subsequently, a second metal layer for creating second leads is formed by sputtering. The contact holes are created to make electrical connection between the first and second leads. In order to facilitate formation of the second leads within the contact holes and to prevent the thickness of the leads from decreasing in the contact holes, the semiconductor substrate is heated during the sputtering process, or the side walls of the contact holes in the insulating film ar sloped.

In the aforementioned prior art techniques, however, as the sizes of the contact holes decrease, it becomes more difficult to prevent the second metal leads from thinning in the holes even if the semiconductor substrate is heated. In the worst case, the second metal leads break, or it is impossible to make electrical connection of the second metal leads with the first metal leads. Where the side walls of the contact holes in the insulating film are tilted, or sloped, the wiring of the second metal leads is improved, and the leads can be prevented from breaking. However, for a given area with which the first and second leads are in contact with each other, the size of the upper end of each contact hole is increased due to the tilt of the side walls. This makes it impossible to fabricate the semiconductor device in a smaller size.

SUMMARY OF THE INVENTION

It is an object of the present invention to provide a method of fabricating a semiconductor device in which minute contact holes are formed but second metal leads are not thinned in the contact holes.

It is another object of the invention to provide a semiconductor device having contact holes through which second metal leads are wired without being thinned.

A fabrication method according to the invention comprises the steps of: forming a first metal layer for creating first metal leads; forming an insulating film on the first metal layer; forming holes in the insulating film; forming a layer of titanium metal on the insulating film and over the holes; thermally treating the layer of titanium metal within an atmosphere of nitrogen or nitriding the layer by plasma within the atmosphere of nitrogen to denature the titanium layer; and forming a second metal layer for creating second metal leads on the layer of titanium and titanium compound.

In one embodiment of the invention, the fabrication method further includes the step of heating the laminate before the step of nitriding the layer of titanium within the atmosphere of nitrogen in order to cause parts of the titanium metal to react with the first metal layer.

The objects according to the invention are further achieved by a semiconductor device having a wiring structure consisting of a first metal layer for creating first metal leads, a second metal layer for creating second metal leads, an insulating film formed between the two layers, a layer of titanium nitride formed on the insulating film underlying the second metal layer and on the side walls in holes formed in the insulating film, and a layer of an alloy formed at the boundary between the two metal layers in the holes, the alloy consisting of the metal forming the first metal layer and titanium.

Other objects and features of the invention will appear in the course of the description thereof which follows.

DETAILED DESCRIPTION OF THE INVENTION

Figure 1A:
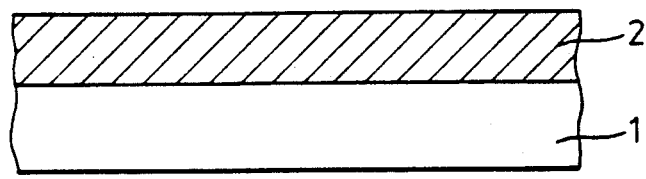
FIGS. 1(a)–1(d) are cross-sectional views illustrating steps successively performed to fabricate a semiconductor device according to the invention.

A method of fabricating a semiconductor device in accordance with the invention is now described with reference to FIGS. 1(a)–1(d). As shown in FIG. 1(a), a first metal layer 2 is formed on a first insulating film 1 consisting of silicon oxide, for example, the insulating film 1 being formed on a semiconductor device, or substrate, made from silicon. In the present example, the metal layer 2 is a film of molybdenum silicide. Instead, the layer 2 can be made of a metal having a low melting point such as an aluminum alloy, a metal having a high melting point such as copper, palladium, titanium, tungsten, or platinum, or a compound of any one of these metals having high melting points and silicon. Metal layer 2 can be patterned to form individual leads.

Figure 1B:
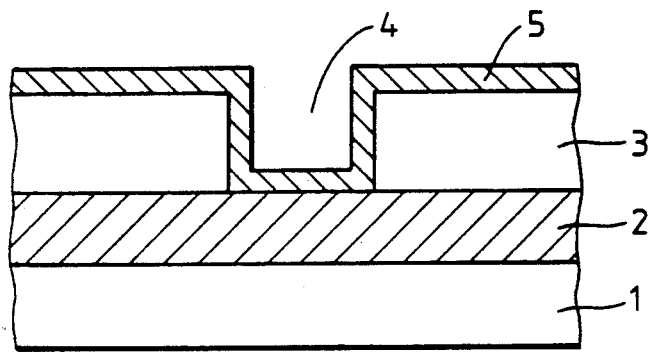

Then, as shown in FIG. 1(b), a second insulating film 3 made from silicon oxide, phosphosilicate glass (PSG), boron phosphosilicate glass (BPSG), or other material is formed on the first insulating film 1 and on the first metal layer 2 to separate the leads formed from metal layer 2. Contact holes 4 are formed in insulating film 3 overlying metal layer 2. A film 5 of titanium metal is formed on the second insulating film 3 and in the holes 4.

Figure 1C:
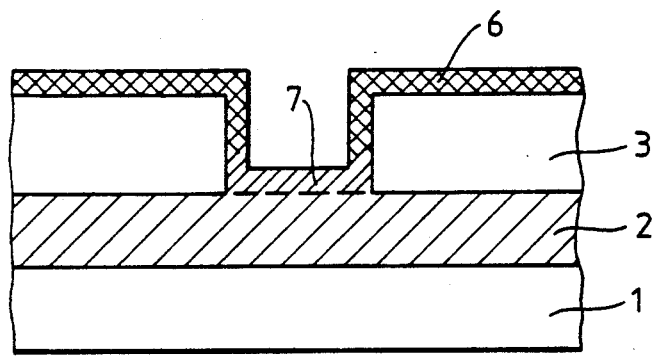

The surface of the semiconductor substrate is then thermally treated in an atmosphere of nitrogen at a temperature of 600° to 800° C., preferably about 700° C., to cause the film of titanium metal 5 on the second insulating film 3 and the film of titanium metal 5 on the side walls in the holes 5 to react with nitrogen to form a film of titanium nitride 6, as shown in FIG. 1(c). At the same time, the titanium metal 5 on the bottom surfaces of the holes 4 reacts with the metal of the layer 2 at a higher rate than the rate of nitridation to form an alloy 7 of titanium and this metal. In the present example, the metal of layer 2 is a compound of molybdenum and silicon. Thus, molybdenum reacts with titanium metal. As a result, a layer 7 of an alloy of molybdenum and titanium is formed on the bottom layer of each hole 4.

One example of the thermal treatment is to expose the surface of the semiconductor substrate to the heat radiation produced from a halogen lamp for a short time. Where the first metal layer 2 is made of a metal having a high melting point, the thermal treatment is carried out for a longer time, or a diffusion furnace is used.

Figure 1D:
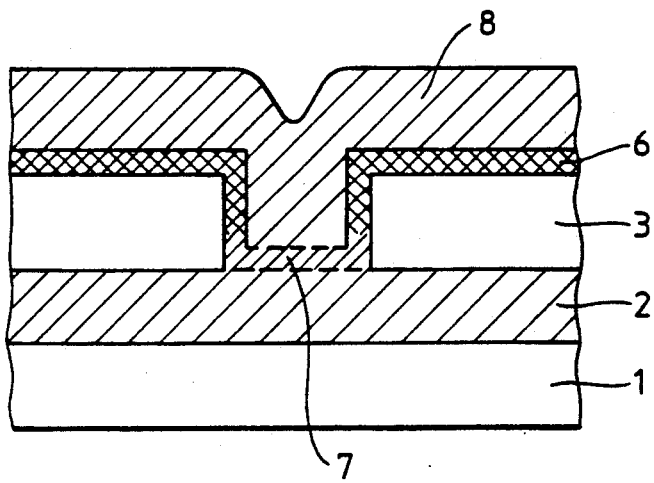

Then, as shown in FIG. 1(d), a second metal layer 8 is formed by sputtering. In the present example, the second metal layer 8 consists mainly of aluminum. Since the second metal layer 8 is formed on a surface of titanium nitride, the layer 8 can adhere better than the case in which layer 8 of metal is directly formed on the surface of an insulating film. Also, the metal of the second layer 8 is not thinned at the step regions. When the second metal layer 8 is sputtered while heating the semiconductor substrate, the metal atoms move along the surface of the layer of titanium nitride and form the metal layer. During this process, the metal atoms remain in the contact holes 4. This substantially eliminates the possibility that the film is thinned in the contact holes. Also, defective adhesion of the second metal is prevented; otherwise electrical connection with the leads of the first metal would not be assured. The metal layer 8 and the underlying the film of titanium nitride 6 are photolithographically patterned to form second metal leads.

In the above example, an aluminum alloy should not be used as the first metal layer 2 because aluminum, having a melting point of 660° C. and boiling point of 2,470° C., will migrate during the thermal treatment at a temperature of 600° to 800° C. However, the first layer 2 can be of a metal having a high melting point, such as copper, palladium, titanium, tungsten, platinum, or a silicide of such a metal having a high melting point.

Figure 2A:
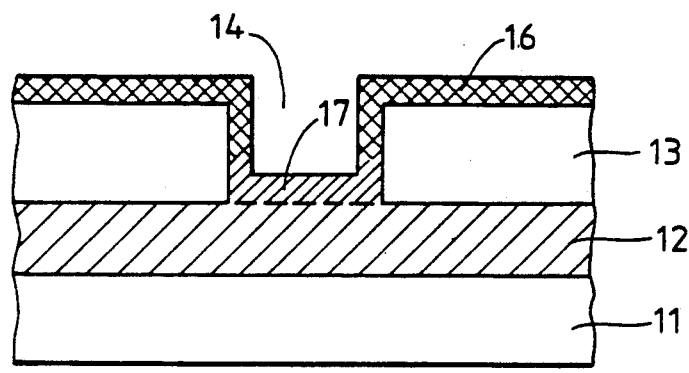
FIGS. 2(a)–2(b) are cross-sectional views illustrating steps performed to fabricate another semiconductor device according to the invention.

Another method of fabricating a semiconductor device in accordance with the invention is next described with reference to FIGS. 2(a) and 2(b). This method is similar to the method already described in connection with FIGS. 1(a)–1(d) except that the first metal layer 2 consists mainly of an aluminum alloy. Two steps similar to the two steps described in conjunction with FIGS. 1(a) and 1(b) are first carried out to fabricate a laminate consisting of a semiconductor substrate (not shown) made from silicon, a first insulating film 11 which is made from silicon oxide and formed on the substrate, a first metal layer 12 formed on the insulating film 11, and a second insulating film 13 formed on the first metal layer 12. A film of titanium metal is then formed on exposed surfaces of film 13 and on the surfaces of holes 4.

The surface of the resulting semiconductor structure is nitrided with plasma in an atmosphere of nitrogen. As an example, the structure is heated at a temperature of 300° to 450° C., preferably about 300° C., in an atmosphere of nitrogen gas at a pressure of the order of $10^{-3}$ torr to tens of torr, preferably about 1 torr. The power of the plasma is hundreds to thousands of watts, preferably about 4 kW. The atmosphere can contain argon gas in addition to nitrogen gas. Titanium metal on the second insulating layer 13 and on the side wall in each contact hole 14 reacts with nitrogen to form a layer of titanium nitride 16, as shown in FIG. 2(a). Concurrently, the titanium metal on the bottom surface of each hole 14 thermally reacts with the first metal 12 at a rate faster than the rate of nitridation, thus forming a layer 17 of an alloy of titanium and the first metal. In the present example, the first metal layer 2 consists principally of aluminum. Thus, aluminum reacts with titanium metal to create layer 17 of the alloy of aluminum and titanium on the bottom surface of each contact hole. Where the first metal layer 12 is of a metal having a high melting point such as molybdenum, copper, palladium, titanium, tungsten, platinum, or a silicide of such a metal having a high melting point, the laminate may be thermally treated either with a halogen lamp producing heat radiation or in a diffusion furnace before the nitridation in the atmosphere of nitrogen.

Figure 2B:
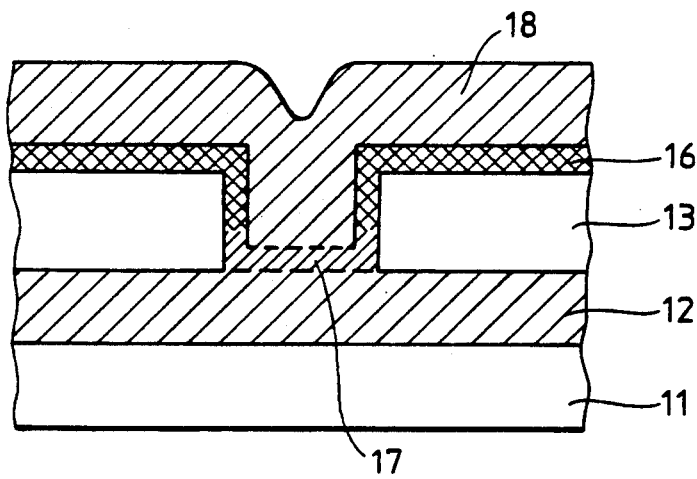

Thereafter, a second metal layer 18 is formed by sputtering, as shown in FIG. 2(b). In the present example, the second metal layer consists principally of aluminum. Since the second metal is deposited on the surface of the layer of titanium nitride, the second metal adheres to the surface better than the case in which the metal is directly deposited on the surface of an insulating film. Also, the layer of the second metal is not thinned on step portions. If the second metal is sputtered while heating the semiconductor substrate, then the metal atoms move along the surface of the layer of titanium nitride to form a metal layer. As a result, the metal atoms stay in the contact holes, and it is very unlikely that the thickness of the metal layer in each contact hole decreases. Hence, the second metal is assured of adhering well to the layer of titanium nitride; otherwise good electrical connection with the leads of the first metal would not be assured. The metal film and the underlying film of titanium nitride are patterned by photolithographic etching to form leads of the second metal. The novel fabrication method offers a semiconductor device in which the second metal film forming leads is not thinned in the contact holes.

In a conventional semiconductor device having an insulating film 0.6 μm thick and contact holes 1 μm², the thickness of the film of the second metal in the holes was approximately 20% of its thickness elsewhere. In a device fabricated in accordance with the invention, the thickness in the holes was about 100% of the thickness elsewhere.

As described thus far, the present invention yields the following advantages.

(1) The film of titanium nitride assures that the second metal layer forming the second leads adheres well. Therefore, the second metal layer is not thinned in the contact holes or on step portions. Also, the leads of the second metal do not break. Consequently, initial troubles with the semiconductor device can be reduced. In addition, electrical current flows reliably through leads of the device.

(2) Since the second metal layer consists of a film of titanium nitride and a film of the second metal, the reliability of the leads is enhanced. The life of the leads in the presence of mechanical stress or stress caused by electrical current is about 10 times as long as the life of the leads of conventional semiconductor devices.

(3) Since a layer of an alloy of the first metal and titanium metal is formed on the bottom surface of each contact hole, the contact resistance produced between the first and second leads can be reduced.

(4) The second metal adheres well to the wall surfaces of the minute contact holes. This makes it unnecessary to incline, or slope, the side surfaces in the holes. Hence further miniaturization of the semiconductor device is facilitated.

(5) Since titanium metal is nitrided using plasma in an atmosphere of nitrogen, the present invention can be practiced even where the first metal layer consists of a metal having a low melting point such as aluminum.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising;
   a semiconductor substrate;
   a first conductive layer of a metal formed over the substrate and formed into first leads;
   an insulating layer formed upon the first conductive layer and provided with holes extending to the first conductive layer;
   a layer containing titanium and disposed upon those portions of the first conductive layer which are expose through the holes and upon the insulating layer including the side walls of the holes, said layer constituting an alloy of titanium and the metal of said first conductive layer where said layer is disposed upon those portions of the first conductive layer which are exposed through the holes, and constituting titanium nitride where said layer is disposed upon the insulating layer including the side walls of the holes; and
   a second conductive layer formed upon the layer containing titanium and formed into second leads.

2. The semiconductor device of claim 1 wherein the second conductive layer consists principally of aluminum.

3. The semiconductor device of claim 1 wherein the first conductive layer consists of a metal containing molybdenum, and the alloy consists of an alloy of titanium and molybdenum.

4. The semiconductor device of claim 3 wherein the second conductive layer consists principally of aluminum.

5. A method of fabricating a semiconductor device, comprising the steps of:
   forming a first insulating film upon a semiconductor substrate;
   forming a first conductive layer for creating first leads upon the first insulating film;
   forming a second insulating film upon the first conductive layer, the second insulating film having holes down to the first conductive layer;
   forming a layer of titanium metal in the holes and upon the second insulating film;
   thermally treating the layer of titanium metal in an atmosphere of nitrogen to change the layer of titanium metal in contact with the first conductive layer exposed through the holes into a layer of a titanium compound and to change the layer of metal on the side walls of the holes and on the second insulating film into a layer of titanium nitride; and
   forming a second conductive layer for creating second leads upon the layer of the titanium compound and upon the layer of titanium nitride.

6. The method of fabricating a semiconductor device according to claim 5 wherein the first conductive layer is a metal layer containing molybdenum, and wherein the titanium compound consists of a compound of titanium and molybdenum.

7. The method of fabricating a semiconductor device according to claim 6 wherein the second conductive layer consists principally of aluminum.

8. The method of fabricating a semiconductor device according to claim 8 wherein the second conductive layer consists principally of aluminum.

9. The method of fabricating a semiconductor device according to claim 5 wherein said step of thermally treating the layer of titanium metal is carried out at a temperature of 600° to 800° C.

10. The method of fabricating a semiconductor device according to claim 5 wherein said step of thermally treating the layer of titanium metal is carried out at a temperature of about 700° C.

11. A method of fabricating a semiconductor device, comprising the steps of:
    forming a first insulating film upon a semiconductor substrate;
    forming a first conductive layer for creating first leads upon the first insulating film;
    forming a second insulating film upon the first conductive layer;
    forming holes in the second insulating film down to the first conductive layer;
    forming a layer of titanium metal in the holes and upon the second insulating film;
    heat treating the layer of titanium metal to change the layer of titanium in contact with the first conductive layer exposed through the holes into a layer of a titanium compound and to change the layer of metal titanium on the side walls in the holes and on the second insulating layer of titanium nitride, said step of heat treating including nitriding the layer of titanium metal with plasma in an atmosphere of nitrogen to form the titanium nitride layer; and
    forming a second conductive layer for creating second leads upon the layer of the titanium compound and upon the layer of titanium nitride.

12. The method of fabricating a semiconductor device according to claim 11, wherein said step of heat treating further comprises heating the laminate so that parts of the layer of titanium metal react with the first conductive layer, prior to the step of nitriding the layer of titanium metal with plasma in an atmosphere of nitrogen.

13. The method of fabricating a semiconductor device according to claim 12 wherein the first conductive layer is a metal layer containing molybdenum, and wherein the layer of the titanium compound consists of a compound of titanium and molybdenum.

14. The method of fabricating a semiconductor device according to claim 13 wherein the second conductive layer consists principally of aluminum.

15. The method of fabricating a semiconductor device according to claim 12 wherein the second conductive layer consists principally of aluminum.

16. The method of fabricating a semiconductor device according to claim 11 wherein the second conductive layer consists principally of aluminum.

* * * * *